US008623741B2

(12) United States Patent
Purushothaman et al.

(10) Patent No.: US 8,623,741 B2
(45) Date of Patent: Jan. 7, 2014

(54) HOMOGENEOUS POROUS LOW DIELECTRIC CONSTANT MATERIALS

(75) Inventors: Sampath Purushothaman, Yorktown Heights, NY (US); Geraud Jean-Michel Dubois, San Jose, CA (US); Teddie P. Magbitang, San Jose, CA (US); Willi Volksen, San Jose, CA (US); Theo J. Frot, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/553,264

(22) Filed: Jul. 19, 2012

(65) Prior Publication Data

US 2012/0282784 A1 Nov. 8, 2012

Related U.S. Application Data

(62) Division of application No. 13/010,004, filed on Jan. 20, 2011, now Pat. No. 8,314,005.

(60) Provisional application No. 61/298,696, filed on Jan. 27, 2010.

(51) Int. Cl.
H01L 21/76 (2006.01)
H01L 21/31 (2006.01)

(52) U.S. Cl.
USPC ............ 438/422; 438/778; 438/780; 438/781

(58) Field of Classification Search
USPC ......... 438/400, 404, 422, 778, 780, 781, 783, 438/E21.576, E21.547, E21.317
See application file for complete search history.

(56) References Cited

U.S. PATENT DOCUMENTS

| | | | |
|---|---|---|---|
| 5,895,263 A | 4/1999 | Carter et al. | 438/624 |
| 6,399,666 B1 | 6/2002 | Hawker et al. | 521/77 |
| 6,451,712 B1 | 9/2002 | Dalton et al. | 438/781 |
| 6,703,324 B2 | 3/2004 | Wong | 438/787 |
| 6,800,330 B2 | 10/2004 | Hayashi et al. | 427/387 |
| 6,893,985 B2 | 5/2005 | Goodner | 438/795 |
| 6,924,222 B2 | 8/2005 | Goodner et al. | 438/622 |
| 7,071,091 B2 | 7/2006 | Clarke et al. | 438/622 |
| 7,229,934 B2 | 6/2007 | Dubois et al. | 438/781 |
| 7,265,437 B2 | 9/2007 | Nguyen et al. | 257/637 |
| 7,282,458 B2 | 10/2007 | Gates et al. | 438/778 |
| 7,288,292 B2 | 10/2007 | Gates et al. | 427/489 |
| 7,303,989 B2 | 12/2007 | Boyanov et al. | 438/637 |

(Continued)

OTHER PUBLICATIONS

"The structure of poly(cyano-p-xylylene):" Park, S.-Y.; Blackwell, J.; Chvalun, S.N.; Nikolaev, A.A.; Mailyan, K.A.; Pebalk, A.V.; Kardash, I.E.; Jul. 22, 1998 (9 pages).

(Continued)

Primary Examiner — Hsien Ming Lee
(74) Attorney, Agent, or Firm — Harrington & Smith

(57) ABSTRACT

In one exemplary embodiment, a method includes: providing a structure having a first layer overlying a substrate, where the first layer includes a dielectric material having a plurality of pores; applying a filling material to an exposed surface of the first layer; heating the structure to a first temperature to enable the filling material to homogeneously fill the plurality of pores; after filling the plurality of pores, performing at least one process on the structure; and after performing the at least one process, removing the filling material from the plurality of pores by heating the structure to a second temperature to decompose the filling material.

18 Claims, 10 Drawing Sheets

(56) References Cited

U.S. PATENT DOCUMENTS

| | | | |
|---|---|---|---|
| 7,312,524 B2 | 12/2007 | Gates et al. | 257/701 |
| 7,399,715 B2 | 7/2008 | Tsuchiya et al. | 438/781 |
| 7,422,975 B2 | 9/2008 | Nogami et al. | 438/619 |
| 7,462,678 B2 | 12/2008 | Akiyama et al. | 528/14 |
| 7,479,306 B2 | 1/2009 | Edelstein et al. | 427/447 |
| 7,510,982 B1 | 3/2009 | Draeger et al. | 438/783 |
| 7,629,272 B2 | 12/2009 | Waldfried et al. | 438/781 |
| 2006/0024849 A1 | 2/2006 | Zhu et al. | 438/12 |
| 2006/0046044 A1 | 3/2006 | Lee et al. | |
| 2007/0077782 A1 | 4/2007 | Lee et al. | 438/781 |
| 2007/0184222 A1* | 8/2007 | Delouise et al. | 428/35.2 |
| 2008/0009141 A1 | 1/2008 | Dubois et al. | 438/758 |
| 2009/0140418 A1 | 6/2009 | Li et al. | 257/734 |
| 2009/0317971 A1 | 12/2009 | Cui et al. | 438/618 |

OTHER PUBLICATIONS

"Infiltrating Semiconducting Polymers into Self-Assembled Mesoporous Titania Films for Photovoltaic Applications", Kevin M. Coakley, et al., Advanced Functional Materials, vol. 13, No. 4, Apr. 2003, p. 301-306.

Kropka et al., "Control of Interfacial Instabilities in Thin Polymer Films with the Addition of a Miscible Component", American Chemical Society, (2006), (pp. 8758-8762).

Barnes, et al., "Suppression of Dewetting in Nanoparticle-Filled Polymer Films", American Chemical Society, (2000), (pp. 4177-4185).

Choi, et al., "Suppress Polystyrene Thin Film Dewetting by Modifying Substrate Surface with Aminopropylthriethoxysilane", Science Direct, (2006), (pp. 1391-1404).

Luzinov, et al., "Thermoplastic Elastomer Monolayers Grafted to a Functionalized Silicon Surface", American Chemical Society, (2000), (pp. 7629-7638).

Mackay, et al., "Influence of Dendrimer Additives on the Dewetting of Thin Polystyrene Films", American Chemical Society, (2002), (pp. 1877-1882).

Ryu, et al., "A Generalized Approach to the Modification of Solid Surfaces", vol. 308 (Apr. 8, 2005), (pp. 236-239).

Park, Soo-Young; "Crystal Structures, Molecular Modeling, and Morphology of Poly(1,5-naphthalene-benzobisoxazole) and Poly(2,6-naphthalene-benzobisoxazole)"; 2006; whole document (22 pages); Kyungpook National University, Daegu, Korea.

* cited by examiner

HOMOGENEOUS POROUS LOW DIELECTRIC CONSTANT MATERIALS

CROSS-REFERENCE TO RELATED APPLICATIONS

This patent application is a divisional of U.S. patent application Ser. No. 13/010,004, filed on Jan. 20, 2011, now U.S. Pat. No. 8,314,005, which claims priority under 35 U.S.C. §119(e) from U.S. Provisional Patent Application No. 61/298,696, filed Jan. 27, 2010, the disclosure of which is incorporated by reference herein in its entirety.

TECHNICAL FIELD

The exemplary embodiments of this invention relate generally to semiconductor devices and, more specifically, relate to porous dielectric materials.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

It is widely known that the speed of propagation of interconnect signals is one of the most important factors controlling overall circuit speed as feature sizes are reduced and the number of devices per unit area increases. Throughout the semiconductor industry, there is a strong drive to reduce the dielectric constant (k) of the interlayer dielectric (ILD) materials such as those existing between metal lines, for example. As a result of such reduction, interconnect signals travel faster through conductors due to a concomitant reduction in resistance-capacitance (RC) delays.

Porous ultra low-k (ULK) dielectrics have enabled capacitance reduction in advanced silicon complementary metal-oxide semiconductor (CMOS) back end of line (BEOL) structures. However, the high level of porosity required (e.g., to achieve k values of 2.4 and lower) create issue in terms of dielectric material damage or loss due to plasma exposures (e.g., reactive ion etch (RIE), strip, dielectric barrier etch) and wet cleans (e.g., post RIE dilute hydrofluoric (DHF) cleans). Additionally, penetration of metals used in the liner layer (e.g., Ta, TaN) or the seed layer (e.g., Cu, Ru) into the pores of the dielectric can occur when porosity is high and the material is characterized by a high degree of pore connectivity. This leads to degradation of the dielectric break down strength and degradation of the leakage characteristics of the dielectric. All of these issues collectively cause reliability degradation in BEOL structures made using highly porous ULK dielectrics.

Various prior art techniques combat the above-identified issues in different manners. In one example, there are techniques to partially repair dielectric damage from plasma exposures. See, e.g., Y. S. Mor, T. C. Chang, P. T. Liu, T. M. Tsai, C. W. Chen, S. T. Yan, C. J. Chu, W. F. Wu, F. M. Pan, W. Lur, and S. M. Sze, "Effective repair to ultra-low-k dielectric material (k.apprx.2.0) by hexamethyldisilazane treatment," *J. Vac. Sci. Technol., B*, vol. 20, pp. 1334-1338, 2002. In another example, there have been attempts to seal surface-connected pores to prevent metal penetration. See, e.g., R. J. O. M. Hoofman, V. H. Nguyen, V. Arnal, M. Broekaart, L. G. Gosset, W. F. A. Besling, M. Fayolle, and F. Iacopi, "Integration of low-k dielectric films in damascene processes," in *Dielectr. Films Adv. Microelectron.*, M. Baklanov, K. Maex, and M. Green, Eds. New-York: Wiley, 2007, pp. 199-250. However, these techniques require deposition of additional layers which can increase the effective dielectric constant of the integrated BEOL structure.

BRIEF SUMMARY

In one exemplary embodiment of the invention, a method comprising: providing a structure comprising a first layer overlying a substrate, where the first layer comprises a dielectric material having a plurality of pores; applying a filling material to an exposed surface of the first layer; heating the structure to a first temperature to enable the filling material to homogeneously fill the plurality of pores; after filling the plurality of pores, performing at least one process on the structure; and after performing the at least one process, removing the filling material from the plurality of pores by heating the structure to a second temperature to decompose the filling material.

In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores; applying a filling material to an exposed surface of the first layer; heating the structure to a first temperature to enable the filling material to homogeneously fill the plurality of pores; after filling the plurality of pores, performing at least one process on the structure; and after performing the at least one process, removing the filling material from the plurality of pores by heating the structure to a second temperature to decompose the filling material.

In a further exemplary embodiment of the invention, a semiconductor structure comprising: a substrate; and a first layer overlying the substrate, where the first layer comprises a dielectric material having a plurality of pores, where the plurality of pores are homogeneously filled by a filling material.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
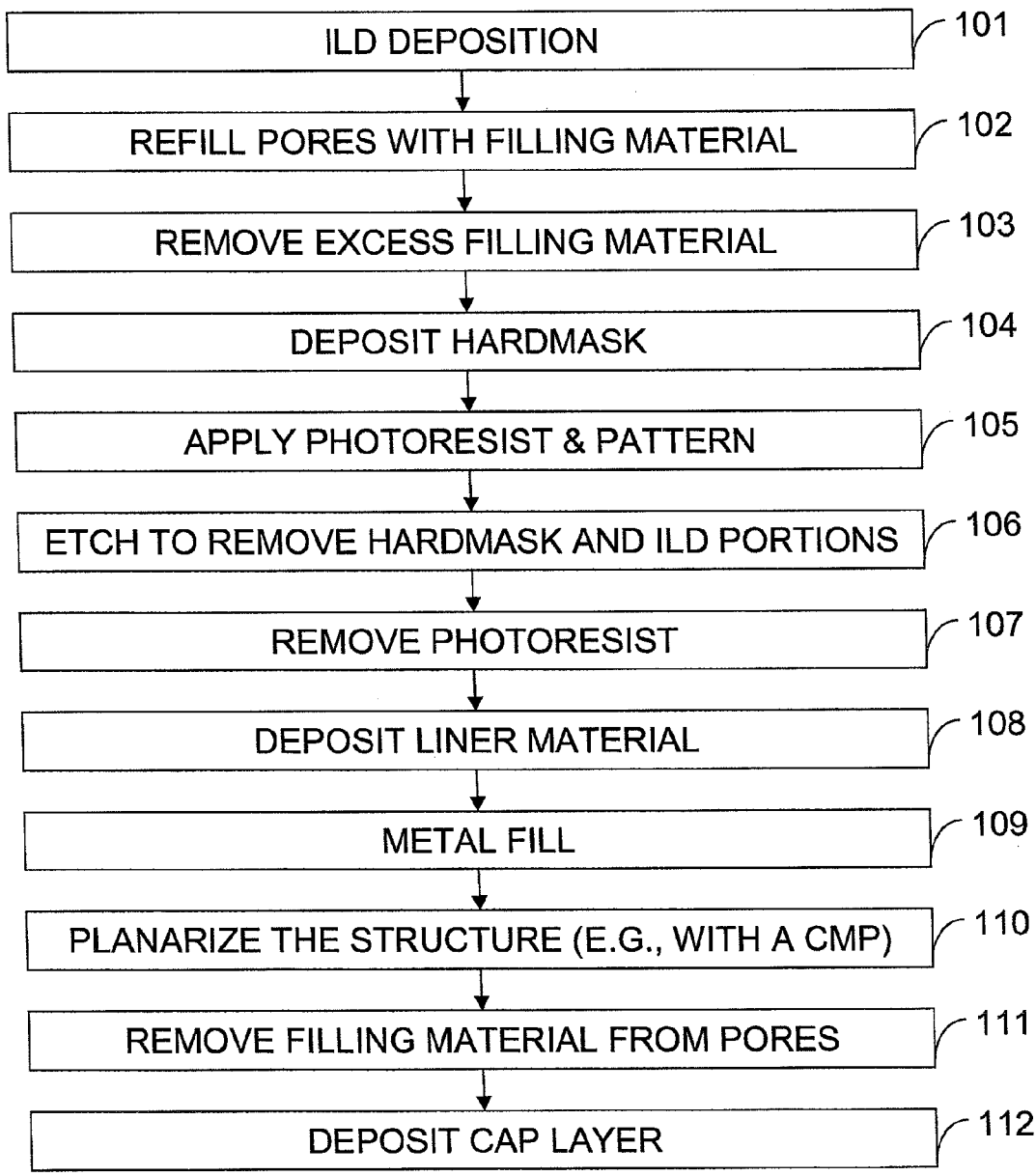
FIG. 1 shows a flowchart illustrating one non-limiting example of a method for practicing the exemplary embodiments of this invention.

Although the design of a low-k dielectric material with desirable properties for implementation is demanding enough, the complexity of modern semiconductor manufacturing processes adds further complications. Some of these are a direct result from trying to utilize $SiO_2$-based processes with porous, low-k dielectric materials that are considerably less forgiving. In this regard, adding porosity may not result in redeeming values (e.g., improved characteristics) other than lowering the dielectric constant. Critical damage to the low dielectric porous material can occur at different stages of the integration process, including: hard-mask deposition, reactive ion etch, photo-resist strip, liner deposition, chemical mechanical polishing, and cap deposition, as non-limiting examples.

Potential solutions present themselves in the form of pore sealing approaches. To date, two pore sealing techniques have been explored. The first interposes an additional layer between the ILD and the barrier layer. The deposition can be accomplished by chemical vapor deposition (CVD) or spin-on techniques, as non-limiting examples, and the material can be organic or inorganic in nature. The inherent k-value of this material will have a direct effect on the overall dielectric constant and for this reason materials with relatively low dielectric constants are preferred. Many different materials have been reported, ranging from $SiO_2$ to organic polymers. The drawback of this approach lies in the introduction of new interfaces which may impact adhesion. In addition, the additional layer at the via bottom could adversely affect the cap-open step and result in damage to the line bottom.

Alternatively, pore sealing can be effected by plasma exposure so as to selectively damage and densify the outer few nanometers of the via/line sidewalls. By fine-tuning and careful selection of plasma chemistries, it is possible to control densification and plasma damage. Unfortunately, this approach works best for microporous materials, while mesoporous materials are easily damaged deep into the ILD (due to interconnectivity) with limited pore sealing success.

Another approach addresses the pore sealing problem from a different perspective. These are so-called "solids first" or "porosity last" alternative integration schemes typically using templating porogens (see, e.g., U.S. Pat. No. 6,451,712). These integration schemes can be further subdivided into post-etch burnout (PEBO) or post-chemical mechanical polishing (CMP) burnout (PCBO) of the porogen. PEBO requires sidewall densification, possibly through porogen decomposition during etch, to subsequently facilitate uniform deposition of liner and metal. PCBO can only be implemented with a top hardmask that is permeable to the porogen decomposition products or by polishing off the top hardmask fully in the CMP step. However, due to temperature limitations dictated by the porogen, process temperatures during damascene processing are limited to below the decomposition temperature of the porogen. In addition, ILD shrinkage during the final porogen burnout is preferably less than 1% in order to maintain integrity of the interconnect structures. Such a target value may be difficult to achieve.

Thus, pore sealing is a difficult process and becomes more difficult as pore diameter increases into the supermicroporous and mesoporous range (>1.5-2 nm), as is typically the case to achieve a dielectric constant k≤2.4. In this size regime, to date PEBO and PCBO schemes appear to be the only hope. However, the requirements associated with these strategies (e.g., shrinkage, special permeable caps) make these approaches challenging to implement with current integration processes. Plasma sealing currently appears to be the preferred route. This technique requires that the pore size remain in the microporous regime with a pore size below 1.5 nm, even at high porosities, which is difficult to achieve.

One prior art technique, as disclosed by U.S. Pat. No. 6,703,324, introduces a secondary component into the void fraction of a porous medium (low dielectric constant film) in order to temporarily improve the mechanical properties such that the porous film has mechanical characteristics of a much stiffer film. Once a process operation such as a chemical mechanical polishing process, which requires greater mechanical strength than that provided by the porous film alone, is completed, the secondary component is removed by displacement or dissolution.

Another prior art technique, as disclosed by U.S. Pat. No. 7,303,989, impregnates the pores of a zeolite low-k dielectric layer with a polymer and forms an interconnect structure therein. This mechanically strengthens the dielectric layer and prevents metal deposits within the pores.

Below, and with reference to FIGS. 1-13, is described one, non-limiting exemplary embodiment illustrating how filling the pores of a porous dielectric film (e.g., a low-k or ULK dielectric film) may be beneficial for processing carried out on the wafer. FIG. 1 depicts a flowchart illustrating one non-limiting example of such a method and is further referred to below with reference to FIGS. 2-13. It is noted that the described exemplary method is for forming a single-damascene interconnect structure. In other exemplary embodiments, a different structure may be formed and/or utilized.

Figure 2:
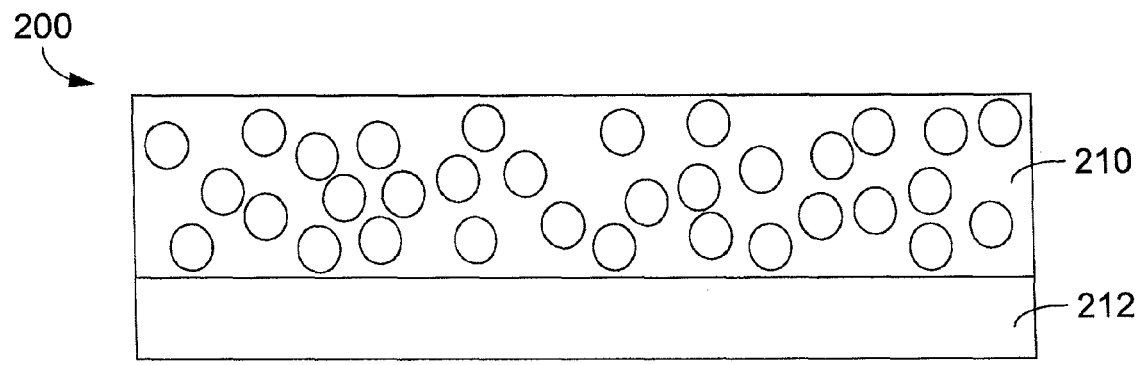
FIGS. 2-13 show a semiconductor wafer at various stages of processing in practicing the exemplary method depicted in FIG. 1.

In FIG. 2 (step 101 of FIG. 1), a semiconductor wafer 200 that has a previous interconnect layer 212 deposited on top is first coated with an ILD layer 210 of a porous material containing empty pores (e.g., an organosilicate), for example, deposited by the best known techniques. As an example, the ILD layer 210 may be suitably formed of single or dual damascene wiring with a high electrical conductivity material (e.g., copper, aluminum, alloys thereof) embedded in a suitable ILD (porous or nonporous) and optionally capped with a diffusion barrier dielectric (e.g., SiN, NBLOK). Detailed make up of layer 212 is omitted in FIGS. 2-12 for purposes of clarity.

Figure 3:
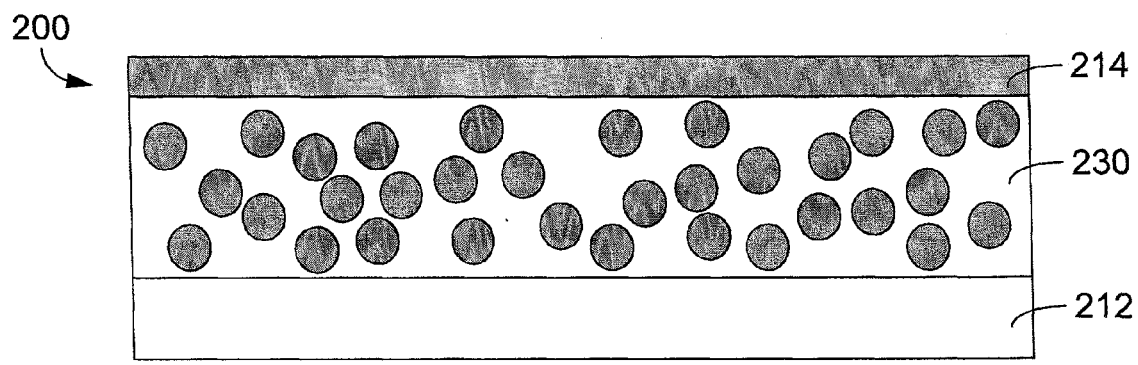

In FIG. 3 (step 102 of FIG. 1), the pores of the porous dielectric are homogeneously refilled with a filling material (e.g., an organic polymer 214). There is an excess layer of the organic polymer 214 that forms at the surface of the filled ILD film 230.

Figure 4:
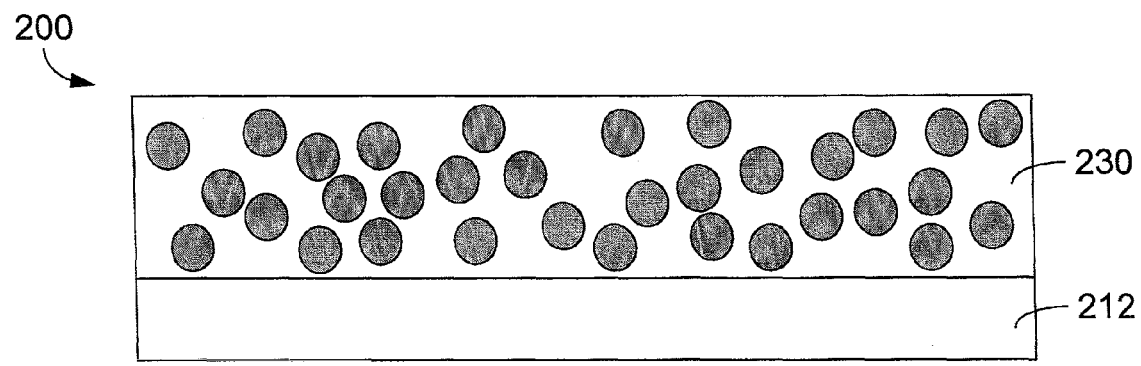

In FIG. 4 (step 103 of FIG. 1), the excess of organic polymer 214 that was deposited on top of the filled ILD film 230 is then removed by a suitable method, such as plasma etch, RIE strip, wet dissolution or gentle polishing. Care should be exercised not to remove the polymer from the filled pores in the structure.

Figure 5:
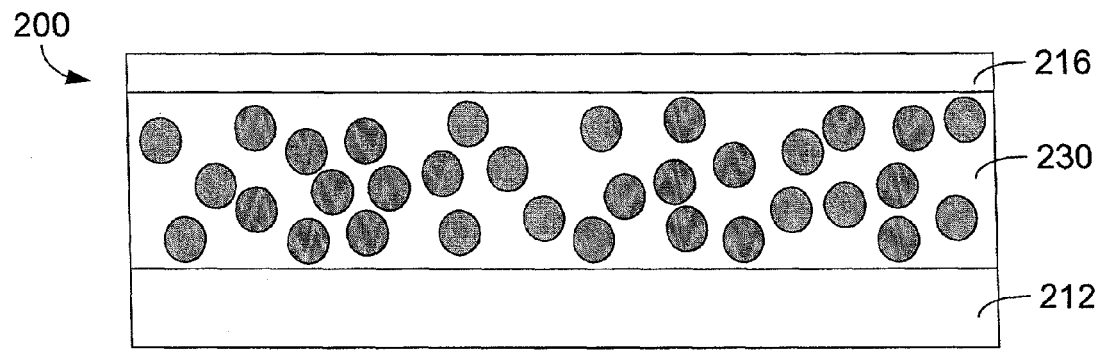

In FIG. 5 (step 104 of FIG. 1), a hardmask layer 216 is deposited on top of the filled ILD layer 230, for example, using plasma enhanced chemical vapor deposition (PECVD) or spin-on techniques. The hardmask 216 can be formed of a suitable material including, as non-limiting examples, $SiO_2$, $Al_2O_3$, SiN, $Si_3N_4$, SiC, SiCOH or another suitable hardmask material as known in the art. The hardmask layer 216 may further be formed by more than one layer of material, though the total thickness preferably should be less than 250 nm and, more preferably, less than 100 nm.

Figure 6:
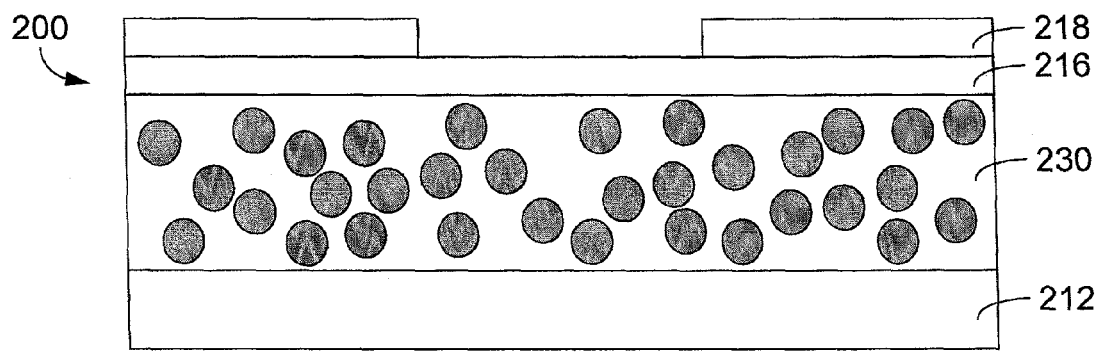

In FIG. 6 (step 105 of FIG. 1), a photoresist layer 218 is applied to the top of the hardmask layer 216, exposed to generate a desired pattern, developed and then baked (e.g., at a temperature on the order of 200° C. or less).

Figure 7:
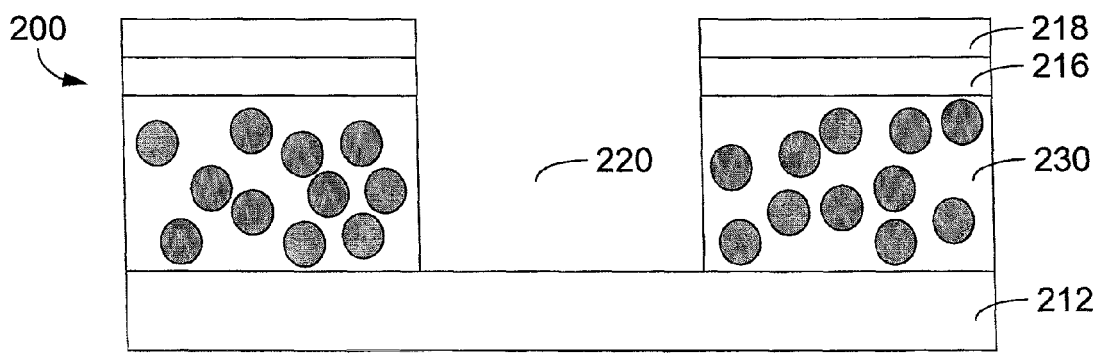

In FIG. 7 (step 106 of FIG. 1), the hardmask layer 216 and the filled ILD layer 230 are etched (e.g., in a plasma etching process) to remove them in those regions defined by openings in the photoresist pattern 218 on top of the hardmask layer 216, creating the opening 220.

Figure 8:
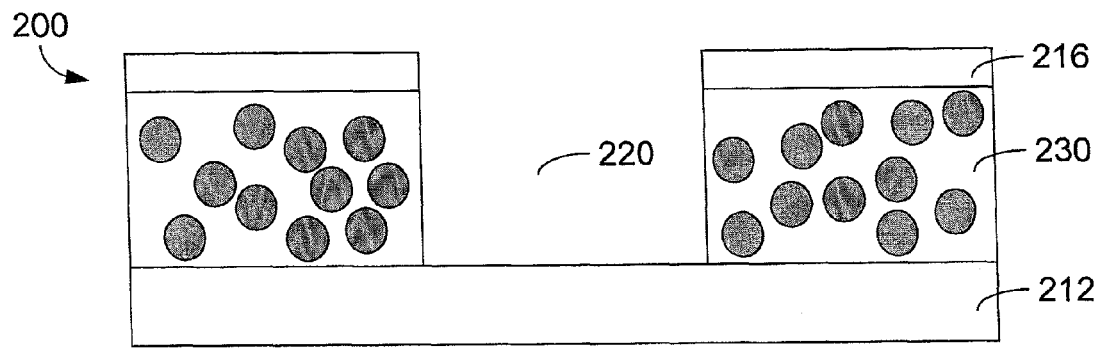

In FIG. 8 (step 107 of FIG. 1), any remnants of the resist layer 214 are removed by a strip process. It should be noted that this is the step where the porosity of the organosilicate is exposed to the strip process chemistry used to remove the photo-resist and damage would otherwise occur to the pores of the filled ILD layer 230 if they were not filled with the polymer. Without first filling the pores, after such an exposure the dielectric constant and the leakage current of the ILD increase significantly. In contrast, as the ILD is in a nonporous hybrid state enriched in carbon due to the refill material now present in the original pores, little or no damage occurs to the filled ILD layer 230.

Figure 9:
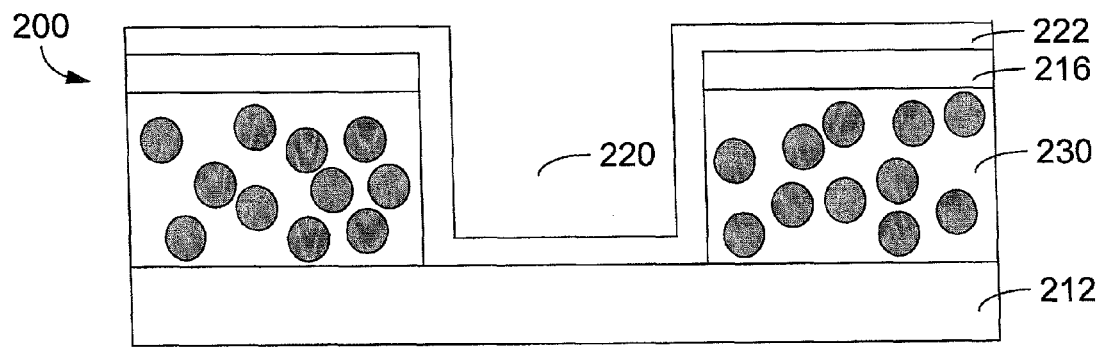

In FIG. 9 (step 108 of FIG. 1), a liner material is deposited to form a liner layer 222 on top of the hardmask layer 216. The liner layer 222 may be comprised of a material such as TaN, TiN, Ti, Ta, or various combinations thereof, as non-limiting examples, for achieving adhesion and diffusion barrier properties.

At this stage, in some exemplary embodiments a seed layer (e.g., copper) is deposited on top of the liner layer 222 (not shown). The seed layer may be deposited by sputtering, for example, and may be used to facilitate subsequent electroplating.

Figure 10:
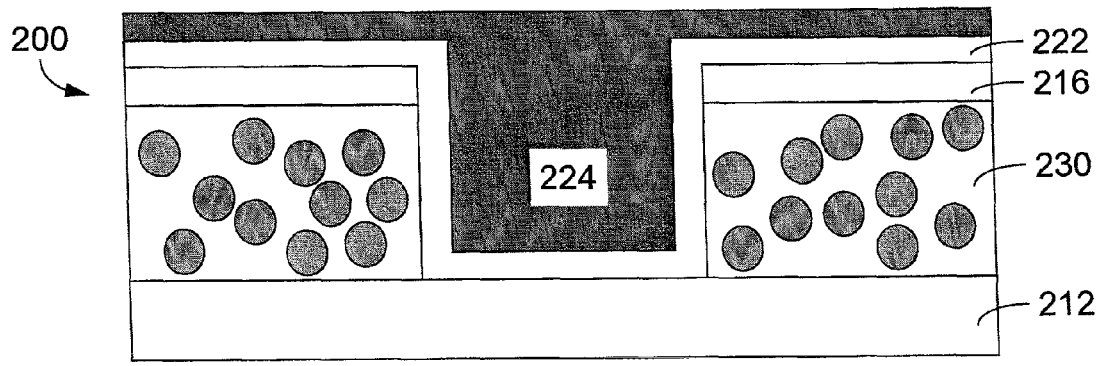

In FIG. 10 (step 109 of FIG. 1), the etched opening 220 is filled with a metal 224, such as copper, for example. The metal may be formed by electroplating, for example, and overfills the opening 220.

Figure 11:
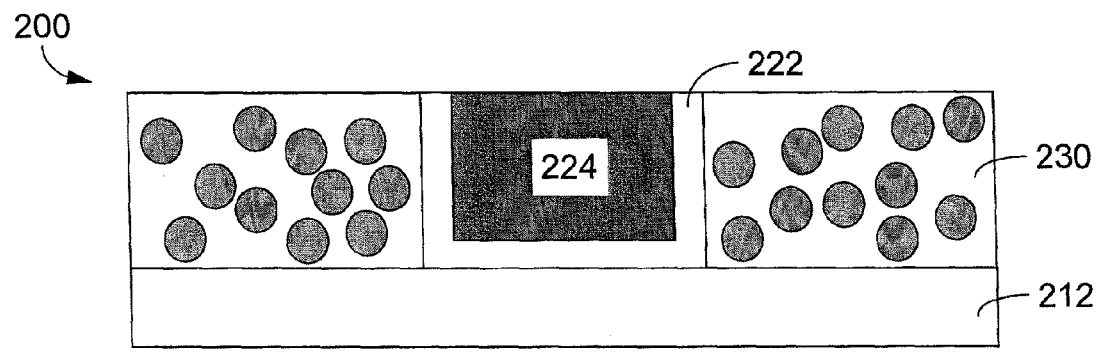

In FIG. 11 (step 110 of FIG. 1), after the etched opening 220 is filled with the metal 224, the electronic structure 200 is planarized (e.g., by a chemical mechanical polishing (CMP) process) to achieve a planar surface with a metal inlaid structure. In this CMP step, polishing is performed until all of the excess metal, liner and hardmask on top of the filled ILD layer 230 are removed, thus exposing at least a top surface of the filled ILD layer 230.

Figure 12:
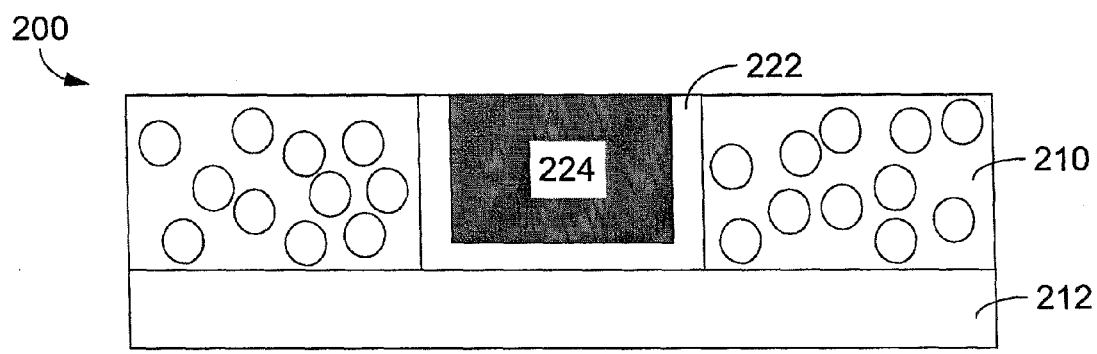

In FIG. 12 (step 111 of FIG. 1), the filling material (e.g., the organic polymer) is removed from the pores, for example, by decomposing it using a thermal curing or a thermal curing assisted by ultraviolet (UV) irradiation, as non-limiting examples.

Figure 13:
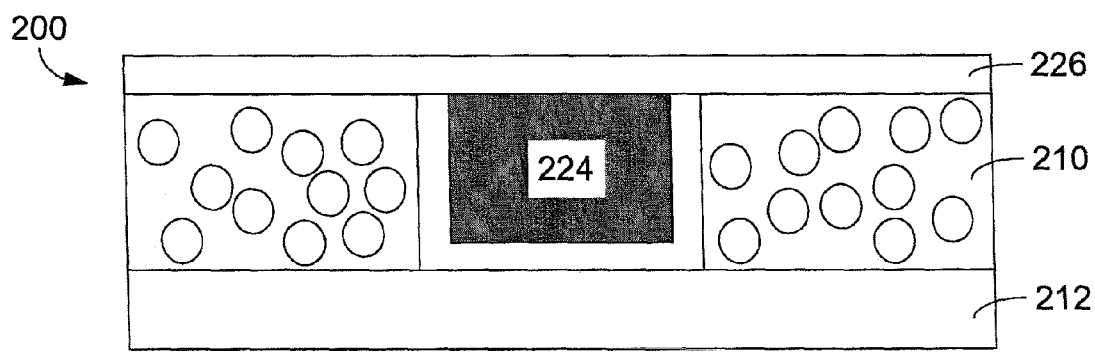

In FIG. 13 (step 112 of FIG. 1), a cap layer 226 of an insulating material (e.g., silicon carbide, silicon nitride, silicon carbonitride, combinations thereof) is deposited on top in order to prevent diffusion of the metal and to protect the electronic device 200 (e.g., from mechanical abrasion or other damage).

As described above, by filling the pores of the porous ILD (e.g., with a polymer, an organosilicate) damage to the ILD (e.g., to the pores of the ILD) can be avoided during processing of the structure. Also as noted above, much of the potential for damage stems from the strip process chemistry used to remove the photo-resist. Without filling the pores, the dielectric constant and the leakage current of the ILD may be adversely affected (e.g., significantly increased).

Filling of the pores is not a simple task. First, the temperature must be controlled. That is, in order to achieve any amount of pore-filling the temperature must be raised to enable the material (e.g., a polymer) to penetrate into the porous material. By the same turn, the temperature must remain below the decomposition temperature of the filling material. Second, achieving homogeneous filling of the porous material is even more difficult. Unless the proper conditions are utilized, the pore-filling will not be homogeneous.

Inhomongeneous filling of the porous material is very undesirable because it yields a material having regions with different properties throughout its thickness. These variations would cause severe issues, such as: differences in etch rate leading to uncontrolled etch depth and profile, and differences in resistance to plasma exposure affecting the electrical integrity of the film. Such variations are likely to have adverse effects on the properties and/or operation of the final structure.

It is noted that the references herein to "homogeneous" filling of the pores with a material refer to a substantially thorough, complete and uniform filling of the pores. That is, homogeneous filling will result in the filled porous material being substantially uniform in composition and, thus, properties. Accordingly, "inhomogeneous" filling results in the filled porous material being non-uniform in composition and properties.

In accordance with the above, exemplary embodiments of the invention enable homogeneous filling of the porous material to provide an improved structure. As an example, homogeneous filling may be realized by utilizing appropriate conditions and/or characteristics, such as a temperature in the appropriate range based at least on the filling material (e.g., polymer) and the pore size, for example. Generally, with the same filling material a smaller pore size will need a higher temperature (i.e., greater energy to push the filling material into the smaller pores). It should further be noted that the conditions for homogeneous filling are dependent on the type or composition of the porous material.

Figure 14:
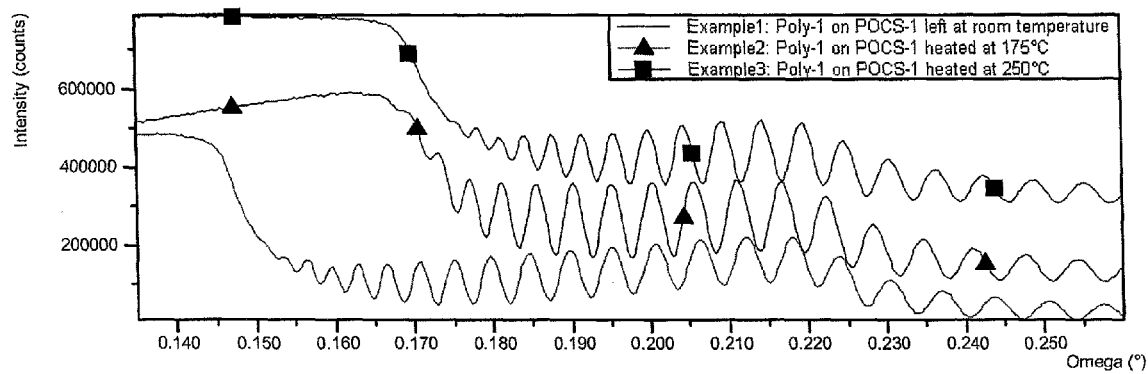
FIGS. 14 and 15 show x-ray reflectivity scans for six examples illustrative of suitable conditions that enable homogeneous pore-filling.
Figure 15:
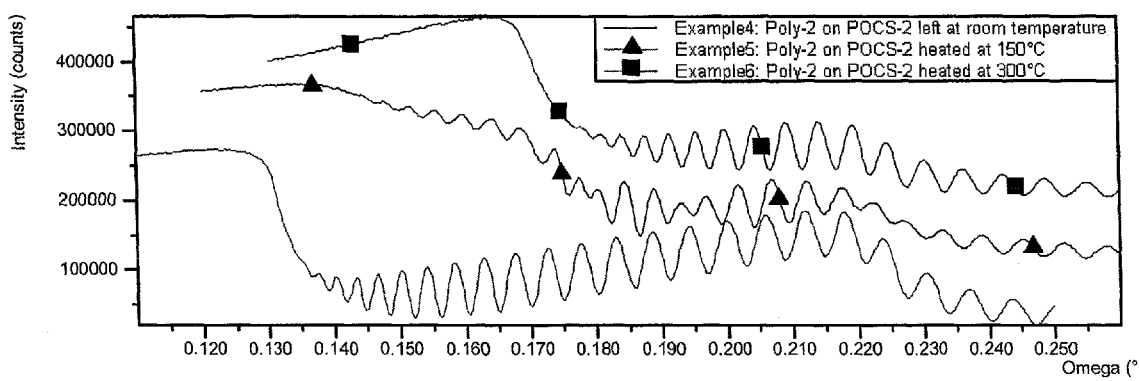

Various examples are described immediately below. These examples are further illustrative of suitable conditions that enable homogeneous pore-filling and, for example, show that a narrow range of temperatures enable homogeneous pore-filling at least for pore sizes from about 1.5-8 nm FIGS. 14 and 15 show x-ray reflectivity scans of intensity (counts) as a function of incident angle ($\omega$, degrees). It should be noted that the symbols (triangle, square) in FIGS. 14 and 15 are not data points in and of themselves and are merely indicia provided to distinguish among the lines of the graphs.

The following examples use a solution of 5 wt. % poly (methyl methacrylate) (weight average molecular weight (Mw)=4700 g/mol) in PGMEA (referred to as "Poly-1") and a solution of 15 wt. % poly(ethylene glycol) (Mw=18500 g/mol) in water (referred to as "Poly-2"). Material details for the low-k materials, POCS-1 and POCS-2, are provided in Table 1 below. POCS-1 and POCS-2 are names used here to identify two porous films having different properties. To prepare these reference porous films, a microelectronic grade formulation composed of a thermally stable organosilicate oxycarbosilane polymer (OCS) and a thermally decomposable organic polymer was used. The ratio of the organic to the organosilicate oxycarbosilane was such that films where the organic polymer has been decomposed reproducibly have a porosity of 36% and 45.5%, respectively, as measured by both nitrogen adsorption (BJH-KJS method) and ellipsometric porosimetry using toluene as the adsorbent (Kelvin model). The density and thickness were obtained using X-ray reflectivity and the refractive index using spectro-reflectometry. POCS-1 and POCS-2 were synthesized by spin-coating the above formulation on an 8-inch silicon wafer, applying first a post-applied bake on a hot plate at 85° C. for 2 minutes and then curing the film in a Yield Engineering Systems Inc. (YES®) polyimide bake oven at 250° C. for 15 minutes using a 5° C./min ramp. The film was then cured at 400° C. for 7 minutes under UV irradiation. This last step leads to the densification of the organosilicate network and the complete removal of the porogen. These two materials were selected to demonstrate that refilling is possible for materials having a pore size between about 1.5 and at least 8 nm.

TABLE 1

| | Density g/cm³ | Thickness nm | Refractive index | Porosity | Pore size diameter nm |
|---|---|---|---|---|---|
| POCS-1 | 0.986 | 520 | 1.304 | 33% | 1.5-3 |
| POCS-2 | 0.753 | 560 | 1.250 | 46% | 6-8 |

Example 1

Poly-1 was spin-coated on top of POCS-1 at 1500 rpm for 1 minute and left at room temperature (20-25° C.). The excess polymer (polymer overburden) was removed. POCS-1 was then analyzed by X-ray reflectivity (XRR). The XRR scan is presented in FIG. 14, and indicates that no refill of the porosity by the polymer was observed. It indicates that no refill of the porosity by the polymer is obtained because the critical angle corresponds to the critical angle of the pristine material. This confirms that the film density did not change and, consequently, that the pores are still empty.

Example 2

Poly-1 was spin-coated on top of POCS-1 at 1500 rpm for 1 minute and heated at 175° C. for 1 minute. The excess polymer (polymer overburden) was removed. POCS-1 was then analyzed by XRR. The XRR scan is presented in FIG. 14, and indicates that an inhomogeneous refill of the porosity by the polymer was observed. It is first observed that the critical angle has shifted from ~0.145° to ~0.168°. This shift indicates that the film density has changed and, therefore, the pores are at least partially filled with the polymer. Nevertheless, some substructures are observed in the critical angle, suggesting that the density is not identical throughout the whole film thickness. Indeed, after fitting the data with a multilayer stack, it was found that an inhomogeneous refill of the porosity by the polymer was observed. The pores closer to the surface of the film are more refilled than the pores at the bottom of the film. If a subsequent thermal cure at 400° C. for at least 15 minutes is performed, the polymer inside the pores is fully decomposed and the XRR scan of example 1 will be obtained.

Example 3

Poly-1 was spin-coated on top of POCS-1 at 1500 rpm for 1 minute and heated at 250° C. for 1 minute. The excess polymer (polymer overburden) was removed. POCS-1 was then analyzed by XRR. The XRR scan is presented in FIG. 14, and indicates that a homogeneous refill of the porosity by the polymer was observed. It is first observed that the critical angle has shifted from ~0.145° to ~0.170°. This shift indicates that the film density has changed and, therefore, the pores are at least partially filled with the polymer. In addition, no substructures were detected in the critical angle, suggesting that the density is identical throughout the whole film thickness. Indeed, the experimental data can be fitted with a monolayer system indicating that a homogeneous refill of the porosity by the polymer was obtained. If a subsequent thermal cure at 400° C. for at least 15 minutes is performed, the polymer inside the pores is fully decomposed and the XRR scan of example 1 will be obtained.

Example 4

Poly-2 was spin-coated on top of POCS-2 at 1500 rpm for 1 minute and left at room temperature (20-25° C.). The excess polymer (polymer overburden) was removed. POCS-2 was then analyzed by XRR. The XRR scan is presented in FIG. 15, and indicates that no refill of the porosity by the polymer was observed because the critical angle corresponds to the critical angle of the pristine material. This confirms that the film density has not changed and, consequently, that the pores are still empty.

Example 5

Poly-2 was spin-coated on top of POCS-2 at 1500 rpm for 1 minute and heated at 150° C. for 1 minute. The excess polymer (polymer overburden) was removed. POCS-2 was then analyzed by XRR. The XRR scan is presented in FIG. 15, and indicates that an inhomogeneous refill of the porosity by the polymer was observed. It is first observed that the critical angle has shifted from ~0.13° to ~0.14°. This shift indicates that the film density has changed and, therefore, the pores are at least partially filled with the polymer. Nevertheless, some substructures are observed in the critical angle, suggesting that the density is not identical throughout the whole film thickness. Indeed, after fitting the data with a multilayer stack, an inhomogeneous refill of the porosity by the polymer was observed. The pores closer to the surface of the film are more refilled than the pores at the bottom of the film. If a subsequent thermal cure at 400° C. for at least 15 minutes is performed, the polymer inside the pores is fully decomposed and the XRR scan of example 4 will be obtained.

Example 6

Poly 2 was spin-coated on top of POCS-2 at 1500 rpm for 1 minute and heated at 300° C. for 1 minute. The excess polymer (polymer overburden) was removed. POCS-2 was then analyzed by XRR. The XRR scan is presented in FIG. 15, and indicates that a homogeneous refill of the porosity by the polymer was observed. It is first observed that the critical angle has shifted from ~0.13° to ~0.165°. This shift indicates that the film density has changed and, therefore, the pores are at least partially filled with the polymer. In addition, no substructures were detected in the critical angle, suggesting that the density is identical throughout the whole film thickness. Indeed, the experimental data can be fitted with a monolayer system, indicating that a homogeneous refill of the porosity by the polymer was obtained. If a subsequent thermal cure at 400° C. for at least 15 minutes is performed, the polymer inside the pores is fully decomposed and the XRR scan of example 4 will be obtained.

In view of the above examples, the following two conclusions are noted:
(1) Filling POCS-1 (pore diameter of about 1.5-3 nm) with poly(methyl methacrylate) (Mw=4700 g/mol) needs a temperature greater than 175° C. for homogeneous filling of the pores; and
(2) Filling PCS-2 (pore diameter of about 6-8 nm) with poly (ethylene glycol) (Mw=18500 g/mol) needs a temperature greater than 150° C. for homogeneous filling of the pores.

Various exemplary embodiments of the invention relate to methods and techniques for fabrication of semiconductor structures (e.g., interconnect structures) that can be employed in a microelectronic device, such as: high speed microprocessors, application specific integrated circuits (ASICs), and memory devices, as non-limiting examples. As a non-limiting example, the exemplary interconnect structures may comprise at least one conductive feature, formed on a substrate, with the substrate further comprising at least one insulating layer surrounding the at least one conductive feature. For example, the at least one insulating layer may surround the at least one conductive feature at its bottom and lateral surfaces. The exemplary structure further may comprise at least one conductive bather layer disposed for at least one interface between the at least one insulating layer and the at least one conductive feature. In some exemplary embodiments, the combination of the at least one conductive feature and the at least one insulating layer may be repeated to form a multilevel interconnect stack. The exemplary interconnect structure may comprise a silicon wafer containing microelectronic devices, a ceramic chip carrier, an organic chip carrier, a glass substrate, a GaAs, SiC or other semiconductor wafer, a circuit board or a plastic substrate, as non-limiting examples.

In accordance with the exemplary embodiments of the invention, a method for forming a porous dielectric material layer in an electronic structure and the structure formed are disclosed.

It is therefore one object of the exemplary embodiments of the invention to provide a method for forming a porous dielectric material layer in an electronic structure that does not have the drawbacks or shortcomings of the conventional methods associated with processing and integration induced damage to the porous dielectric materials.

In one exemplary embodiment, a method for forming a porous dielectric material layer in an electronic structure is carried out by the steps of providing a pre-processed electronic substrate, depositing a layer of porous dielectric material on top of the pre-processed electronic substrate, refilling the pores of the porous dielectric material with a polymeric species, defining and patterning the layer of dielectric material using a photo-resist and hard-mask, removing the photo-resist, depositing the liner, filling the structure with copper, polishing the excess of copper and the residual hard-mask and thermally curing the electronic substrate to decompose the polymer in the pores (e.g., temperatures typically about 350° C. to about 425° C.) transforming the pores-filled dielectric material into a porous dielectric material.

In another exemplary embodiment, a method for forming a porous dielectric material layer in an electronic structure can be carried out by the steps of providing a pre-processed electronic substrate, depositing a layer of porous dielectric material on top of the pre-process electronic substrate, refilling the pores of the porous dielectric material with a polymeric species, defining and patterning the layer of dielectric material, removing the photo-resist, depositing the liner, filling the structure with copper, polishing the excess of copper and the residual hard-mask and decomposing the polymer in the pores by using thermal curing assisted with IJV irradiation (e.g., temperatures typically about 100° C. to about 400° C.) transforming the pores-filled dielectric material into a porous dielectric material.

It is another object of the exemplary embodiments of the invention to provide a method for forming a porous dielectric material layer in an electronic structure that is not subjected to attack by reactive ion etching gases during a patterning process. It is another object of the exemplary embodiments of the invention to provide a method for forming a porous dielectric material layer in an electronic structure that is not subjected to attack by photo-resist strip during a patterning process. It is another object of the exemplary embodiments of the invention to provide a method for forming a porous dielectric material layer in an electronic structure that is not subjected to liner penetration during the liner deposition process. It is another object of the exemplary embodiments of the invention to provide a method for forming a porous dielectric material layer in an electronic structure that is not subjected to attack by CMP slurry during chemical metal polishing. It is another object of the exemplary embodiments of the invention to provide a method for forming a porous dielectric material layer in an electronic structure that mitigates line bottom roughening, pitting and micro-trenching during cap opening process.

A further exemplary embodiment of the invention provides a method for forming a porous dielectric material layer in an electronic structure by first forming a porous dielectric material layer that has reached its maximum shrinkage, refilling the pores with a monomer and a photo initiator, exposing the material to UV to create a polymer inside the pores, patterning the layer in a reactive ion etching process, removing the photo-resist, depositing the liner, filling the structure with metallic copper, removing the excess of copper and hard-mask using chemical metal polishing and then forming pores in the dielectric material layer by removing the filling material.

A further exemplary embodiment of the invention provides a method for forming a porous dielectric material layer in an electronic structure by first forming a porous dielectric material layer that has reached its maximum shrinkage, refilling the pores with a monomer and a radical initiator, thermally curing the material to create a polymer inside the pores, patterning the layer in a reactive ion etching process, removing the photo-resist, depositing the liner, filling the structure with metallic copper, removing the excess of copper and hard-mask using chemical metal polishing and then forming pores in the dielectric material layer by removing the filling material.

Another exemplary embodiment of the invention provides an electronic structure that has a layer of porous dielectric material formed therein wherein the layer of porous material has a porosity between about 25 vol. % and about 80 vol. %. Another exemplary embodiment of the invention provides an electronic structure that has a layer of porous dielectric material formed therein for electrical insulation wherein the porous dielectric material has a dielectric constant between about 1 and about 2.4, preferably between 1.4 and 2.4. Another exemplary embodiment of the invention provides an electronic structure that has a layer of porous dielectric material formed therein for electrical insulation wherein the conductive metal may be copper, aluminum, or another metal such as silver, gold and alloys thereof, as non-limiting examples. Another exemplary embodiment of the invention provides an electronic structure that has a layer of porous dielectric material formed therein for electrical insulation wherein the dielectric material is deposited by PECVD or spin-on techniques.

Another exemplary embodiment of the invention provides an electronic structure that has a layer of porous dielectric material formed therein for electrical insulation, wherein the dielectric material comprises at least one of methyl silsesquioxane (MSSQ), hydrogen silsesquioxane (HSQ), oxycarbosilane (OCS), silica, copolymers thereof and aromatic thermoset polymers such as the SILK® Semiconductor Dielectric or Flare®, as non-limiting examples. Non-limiting examples of suitable porous dielectric materials include those mentioned in the following U.S. Pat. Nos. 7,479,306, 7,312,524, 7,288,292, 7,282,458, and 7,229,934. Further non-limiting examples of suitable porous dielectric materials include those mentioned in U.S. Patent Application Publication Number 2008/0009141.

Another exemplary embodiment of the invention provides an electronic structure that has a layer of porous dielectric material formed therein for electrical insulation wherein the dielectric material can be refilled with polymers which are already well known in the art. In one exemplary embodiment, the decomposable polymer is a linear or branched polymer selected from the group of polyimides, polyamic acid, poly (amic alkyl esters), polybenzoxazoles, polyarylene ethers, polyarylenes, parylenes, polynaphtalenes, silicon-substituted polyimides, polyquinoxalines, poly(2-alkyl oxazolines), poly (N,N-dialkylacrylamides), poly(caprolactones), polyesters, polylactides, polystyrenes, substituted polystyrenes, poly-alpha methylstyrene, substituted poly-alpha methyl polystyrenes, aliphatic polyolefins, polynorbornenes, polyacrylates, polymethacrylates, and polyethers. Among the latter, particularly polyethylene oxide, polypropylene oxide and polytetrahydrofuran are preferred. The decomposable polymer is preferably a linear polymer, a linear di or tri-block copolymer, hyperbranched or a polymeric unimolecular amphiphile. Reference is made to U.S. Pat. Nos. 5,895,263 and 6,399,666 for further examples of suitable decomposable polymers.

Another exemplary embodiment of the invention provides a method for forming an interlayer dielectric material (ILD) layer suitable for use in an electronic structure, and more particularly, discloses a method for forming a porous dielectric material layer in an electronic structure by first forming a first porous dielectric material layer that has reached its maximum shrinkage, and then refilling the pores with a thermally labile material thus rendering the ILD nonporous, patterning the nonporous ILD layer in a reactive ion etching process, removing the photo-resist, depositing the liner and seed metals, filling the structure with conductive metal such as copper, removing the excess of all metals and hard-mask from above the ILD using chemical mechanical polishing and then reforming pores to form a second and final dielectric material layer trough a thermal or thermal/UV curing process to remove the filling material.

Another exemplary embodiment of the invention provides a method for forming a porous dielectric material layer in an electronic structure by first providing an electronic structure that has devices built on top, depositing a layer of a porous dielectric material layer that has reached its maximum shrinkage on top of the electronic structure, and then refilling the pores with a thermally labile material, patterning the layer in a reactive ion etching process, removing the photo-resist, depositing the liner, filling the structure with metallic copper, removing the excess of copper and hard-mask using chemical mechanical polishing and then annealing the electronic structure at a temperature not less than the volatilization temperature of the thermally labile material to generate the porous dielectric material.

In some exemplary embodiments, the filling material comprises an organic thermally labile material which has a decomposition temperature higher than the temperatures used during at least one of (and possibly all of): hard-mask deposition, lithography, reactive ion etch, photo-resist strip, liner deposition, copper seed and plate and CMP. As an example, the organic thermally labile material may have a decomposition temperature between 300° C. and 425° C. In some exemplary embodiments, maximum homogeneous filling may be obtained by heating the structure for about or less than 1 minute.

Another exemplary embodiment of the invention provides an electronic structure that has a layer of damage-free porous dielectric material formed therein for electrical insulation which includes a pre-processed electronic substrate, a layer of porous dielectric material that has a porosity between about 25 vol. % and about 80 vol. % formed and patterned on the pre-processed electronic substrate, and a conductive metal filling the pattern formed in the layer of porous dielectric material. The porous dielectric material may have a dielectric constant between about 1 and about 2.4, and preferably between about 1.4 and about 2.4. The conductive metal filling the pattern may comprise copper, aluminum, silver or gold forming a single damascene (e.g., comprising wiring lines only) or a dual damascene (e.g., comprising wiring lines and contact vias) interconnect structure.

Another exemplary embodiment of the invention provides a process which eliminates the problem of damage to the porous structure during the dielectric material patterning, etching, metal filling and/or CMP process steps. One exemplary method patterns a material where the pores have been refilled with an organic material leading to a non-porous structure during these processes such that the problem of damage to the porous structure and penetration of metallic or other processing chemical species into pores can be avoided.

In accordance with the exemplary embodiments of the invention, structures can be built with porous low k materials such as silicate materials (e.g., silica, hydrogensilsesquioxane, methylsilsesquioxane, oxycarbosilane and copolymers thereof), as a non-limiting example. In some exemplary embodiments, the porosity is interconnected to ensure a good refilling of the pores with the polymeric material. This is generally the case for porosity >25%. The problems encountered in the conventional prior art damascene method are solved by taking advantage of the nonporous nature of the pores refilled dielectric material during processing steps, thus preventing any damage to the porous structure during integration.

In many cases, current low dielectric constant materials considered for $k \leq 2.4$ are first deposited with a chemical composition containing a silicate or an organosilicate and various amounts of a second phase polymeric material, which is a pore-forming agent, referred to as "porogen" in the art. These composite materials are then made into a porous film with a dielectric constant in a range between about 1.4 and about 2.4 after removing the porogen phase. The word "about" used in this writing indicates a range of values. For example, such an exemplary range may be of +/−10% from the average value given. The second phase polymeric material, or the pore forming agent, is a material that is usually a long chained organic polymer which can be decomposed and volatilized and driven from the matrix material, i.e. the organosilicate, after the film has been cured in a curing process, for example.

Another exemplary embodiment of the invention provides a method that can be carried out by first spin-coating a film onto the surface of a silicon wafer and then furnace curing the film at about 400° C. Instead of a simple thermal cure; the film can also be directly treated in a UV chamber at 350 to 400° C. for 1 to 15 minutes to effect a shorter UV radiation assisted thermal process. The film formed may comprise a cross-linked organosilicate where the porogen has been fully removed. The film is usually deposited to a thickness, for example, between about 50 nm and about 1000 nm, or preferably between about 150 nm and about 400 nm, as non-limiting examples. This film has reached its maximum shrinkage if no further treatment at temperatures higher than the cure temperature is performed. A polymer then may be spin-coated onto the porous film and the film is cured on a hot plate at temperatures, for example, between 100° C. and 250° C., preferably 200 to 250° C., as non-limiting examples. The polymer is designed such that it infiltrates into the pores of the cured porous dielectric film below forming an organic/organosilicate hybrid dielectric film. The excess of polymer on top the hybrid dielectric film is then removed by using typical photoresist strip conditions such as plasma ashing, for example. A hardmask material is then deposited on top of the hybrid film. The hardmask material may comprise at least one of $SiO_2$, $Al_2O_3$, $Si_3N_4$, SiC and SiCOH. The hardmask layer deposition should be conducted at a temperature below the decomposition temperature of the organic polymer filling the pores, preferably at 300° C. or below, as a non-limiting example. The hardmask may be comprised of more than one layer of material, however, the total thickness is usually less than 250 nm, for example, and more preferably less than 100 nm, as a non-limiting example. The hardmask layer can be deposited by PECVD or spin on methods, as non-limiting examples. In the case of the PECVD hardmask, the deposition temperature should be lower than the organic polymer decomposition temperature. In the case of a spin-on hardmask, the solvent used to spin-coat the hardmask layer should be carefully chosen so as not to remove the organic polymer from the pores of the organosilicate during spin-coating. The curing temperature of the spin-on hardmask should also be lower than the decomposition temperature of the organic polymer.

In this exemplary embodiment, a photoresist layer is then applied on top of the hardmask layer and exposed and baked (e.g., at a temperature of about 200° C. or less). Next, the hardmask layer is etched in a plasma reactive ion etching process to remove the hardmask and the organosilicate material in the regions defined by the photoresist pattern. This may be followed by one or more of the usual integration steps of photo-resist strip, liner deposition, seed copper deposition and plated copper deposition. The excess of copper, as well as the hardmask layers, is then polished using CMP leaving the interconnect pattern inlaid in the hybrid dielectric layer. Since the hybrid dielectric film is a nonporous film made of an organosilicate film with an organic polymer that blocks all the pores, there is no damage to the organosilicate matrix during all of the different integration steps described above. Finally, the full structure is heated to a temperature higher than the decomposition temperature of the organic polymer (e.g., 400° C. to 425° C.) for a time period long enough to drive out the second phase polymeric material from the organosilicate matrix resulting in a porous low-k dielectric film in the finished interconnect structure. As non-limiting examples, the void content in the final porous dielectric film may be between about 25 vol. % and about 80 vol. %, or preferably between about 25 vol. % and about 60 vol. %, commensurate with the starting porous organosilicate film before refilling. The final curing temperature can also be lower than 400° C. if the thermal removal treatment is assisted by UV irradiation, for example.

The weight average molecular weight of the organic polymeric materials used to refill the pores should be below 10,000 g/mol, preferably below 5,000 g/mol to enable full penetration into the porous structure. Examples of suitable decomposable polymers have been described above.

In further exemplary embodiments, the polymer is generated in situ inside the pores, for example, by using ring opening polymerization starting from monomers such as lactones, butyrolactones, valerolactones, caprolactones and lactides, as non-limiting examples. In other exemplary embodiments, radical initiated polymerization is used starting from monomers such as acrylates, methacrylates and styrenes, as non-limiting examples. This exemplary method enables the use of very low molecular weight precursors to be infiltrated into the pores in a facile manner and converted to a polymer inside the pores by an in situ polymerization process.

Another exemplary embodiment of the invention includes a method for forming a porous dielectric material layer that is used to form a dual damascene interconnect in a semiconductor structure and is performed by refilling of the pores after thermal curing of the dual damascene organosilicate ILD before hardmask deposition and decomposition of the organic polymer after direct CMP, similar to the above description for a single damascene structure.

It is noted that the temperature for the refill may depend, at least in part, on the nature (composition) of the porous material. For example, if the surface of the porous material has a good affinity for the filling material (e.g., a polymer), the penetration temperature will be lower since less energy is needed to drive the filling material into the pores.

In some exemplary embodiments, the filling material may comprise a low molecular weight material. As an example, a low molecular weight may be considered to correspond to a molecular weight of the material (e.g., a polymer) between about 100 g/mol and about 5,000 g/mol. Polymers may be synthesized in a wide range of molecular weights and, thus, any suitable polymer may be utilized in conjunction with the exemplary embodiments of the invention. For example, polystyrene may be synthesized with a molecular weight ranging from 100 to 20,000,000 g/mol or more.

Figure 19:
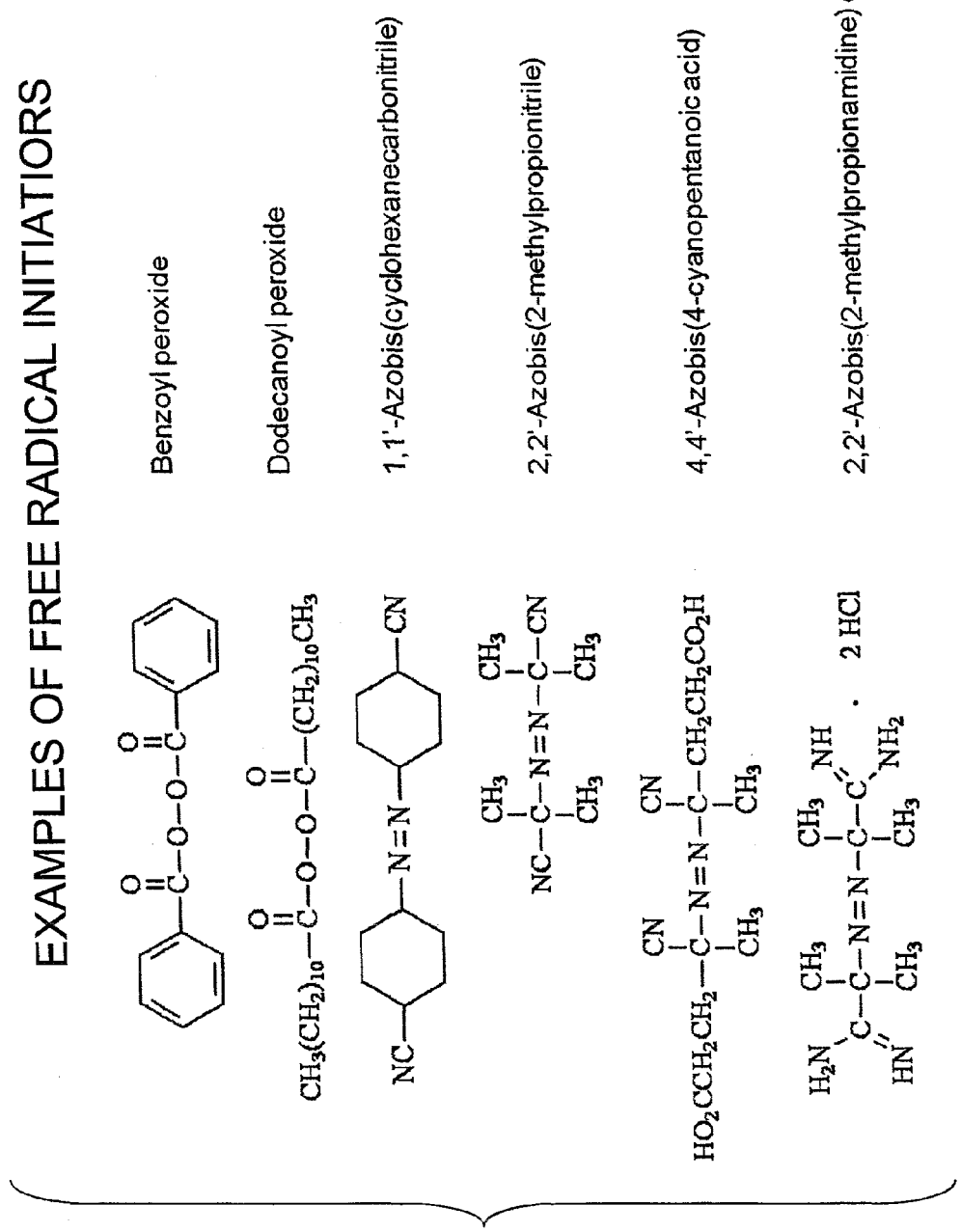
FIG. 19 shows examples of free radical initiators.

In accordance with various exemplary embodiments of the invention, FIG. 19 shows examples of suitable (free) radical initiators that may be utilized. One of ordinary skill in the art will appreciate that any suitable radical initiator may be employed.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 16:
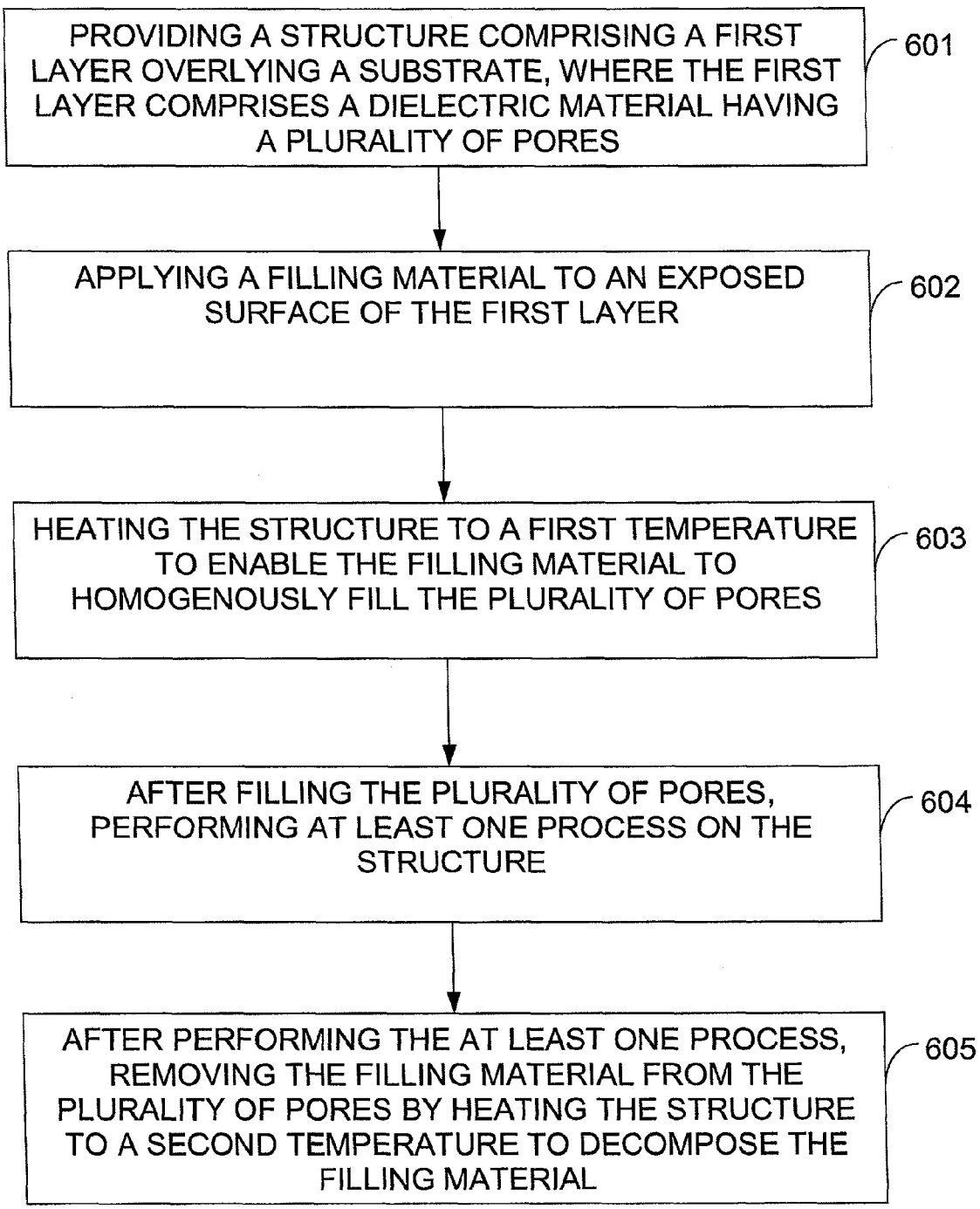
FIGS. 16-18 depict flowcharts illustrating non-limiting examples of methods for practicing the exemplary embodiments of this invention.

(1) In one exemplary embodiment of the invention, and as illustrated in FIG. 16, a method comprising: providing a structure comprising a first layer overlying a substrate, where the first layer comprises a dielectric material having a plurality of pores (601); applying a filling material to an exposed surface of the first layer (602); heating the structure to a first temperature to enable the filling material to homogeneously fill the plurality of pores (603); after filling the plurality of pores, performing at least one process on the structure (604); and after performing the at least one process, removing the filling material from the plurality of pores by heating the structure to a second temperature to decompose the filling material (605).

A method as above, where the homogeneous filling of the plurality of pores comprises a substantially thorough, complete and uniform filling of the plurality of pores with the filling material. A method as in any above, where the homogeneous filling of the plurality of pores results in the first layer having a substantially uniform composition. A method as in any above, where the filling material comprises a polymer or a material having a weight average molecular weight below about 10,000 g/mol. A method as in any above, where the filling material comprises a low molecular weight material. A method as in any above, where the first temperature is dependent on a size of the plurality of pores and a composition of the filling material. A method as in any above, where the first temperature is dependent on a composition of the dielectric material. A method as in any above, where the second temperature is greater than the first temperature. A method as in any above, where the first temperature is dependent on at least one of a composition of the filling material, a characteristic of the filling material, and a composition of the dielectric material.

A method as in any above, where the first temperature is dependent on at least one of a composition of the filling material and a characteristic of the filling material. A method as in any above, where the first temperature is selected to ensure homogeneous filling of the plurality of pores with the filling material. A method as in any above, where removing the filling material from the plurality of pores further comprises using ultraviolet irradiation. A method as in any above, where the filling material comprises a monomer and a photo initiator, the method further comprising: after filling the plurality of pores and prior to performing the at least one process, exposing the structure to ultraviolet radiation to convert the filling material into a polymer. A method as in any above, where the dielectric material of the provided first layer has reached its maximum shrinkage, where the filling material comprises a monomer and a radical initiator, where heating the structure to the first temperature converts the filling material into a polymer. A method as in any above, where heating the structure to a first temperature to enable the filling material to homogeneously fill the plurality of pores comprises filling 5% to 100% of the plurality of the pores (the porosity) with the filling material (e.g., preferably more than 60%). A method as in any above, further comprising one or more aspects of the exemplary embodiments of the invention as described herein.

A method as in any above, implemented as a computer program. A method as in any above, implemented as a computer program stored (e.g., tangibly embodied) on a computer-readable medium (e.g., a program storage device, a memory, a computer-readable memory medium, a non-transitory program storage device). A computer program comprising program instructions that, when performed by a processor, perform operations according to one or more (e.g., any one) of the methods described herein. A method as in any above, implemented as a program of instructions tangibly embodied on a program storage device, execution of the program of instructions by an apparatus (e.g., processor, data processor, machine, computer) resulting in operations comprising the steps of the method.

(2) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores (601); applying a filling material to an exposed surface of the first layer (602); heating the structure to a first temperature to enable the filling material to homogeneously fill the plurality of pores (603); after filling the plurality of pores, performing at least one process on the structure (604); and after performing the at least one process, removing the filling material from the plurality of pores by heating the structure to a second temperature to decompose the filling material (605).

A program storage device as in any above, further comprising one or more aspects of the exemplary embodiments of the invention as described herein.

(3) In a further exemplary embodiment of the invention, a semiconductor structure comprising: a substrate; and a first layer overlying the substrate, where the first layer comprises a dielectric material having a plurality of pores, where the plurality of pores are homogeneously filled by a filling material.

A semiconductor structure as in any above, further comprising one or more aspects of the exemplary embodiments of the invention as described herein.

(4) In another exemplary embodiment of the invention, an apparatus comprising: means for providing a structure comprising a first layer overlying a substrate, where the first layer comprises a dielectric material having a plurality of pores; means for applying a filling material to an exposed surface of the first layer; means for heating the structure to a first temperature to enable the filling material to homogeneously fill the plurality of pores; means for, after filling the plurality of pores, performing at least one process on the structure; and means for, after performing the at least one process, removing the filling material from the plurality of pores by heating the structure to a second temperature to decompose the filling material.

An apparatus as in any above, further comprising one or more aspects of the exemplary embodiments of the invention as described herein.

Figure 17:
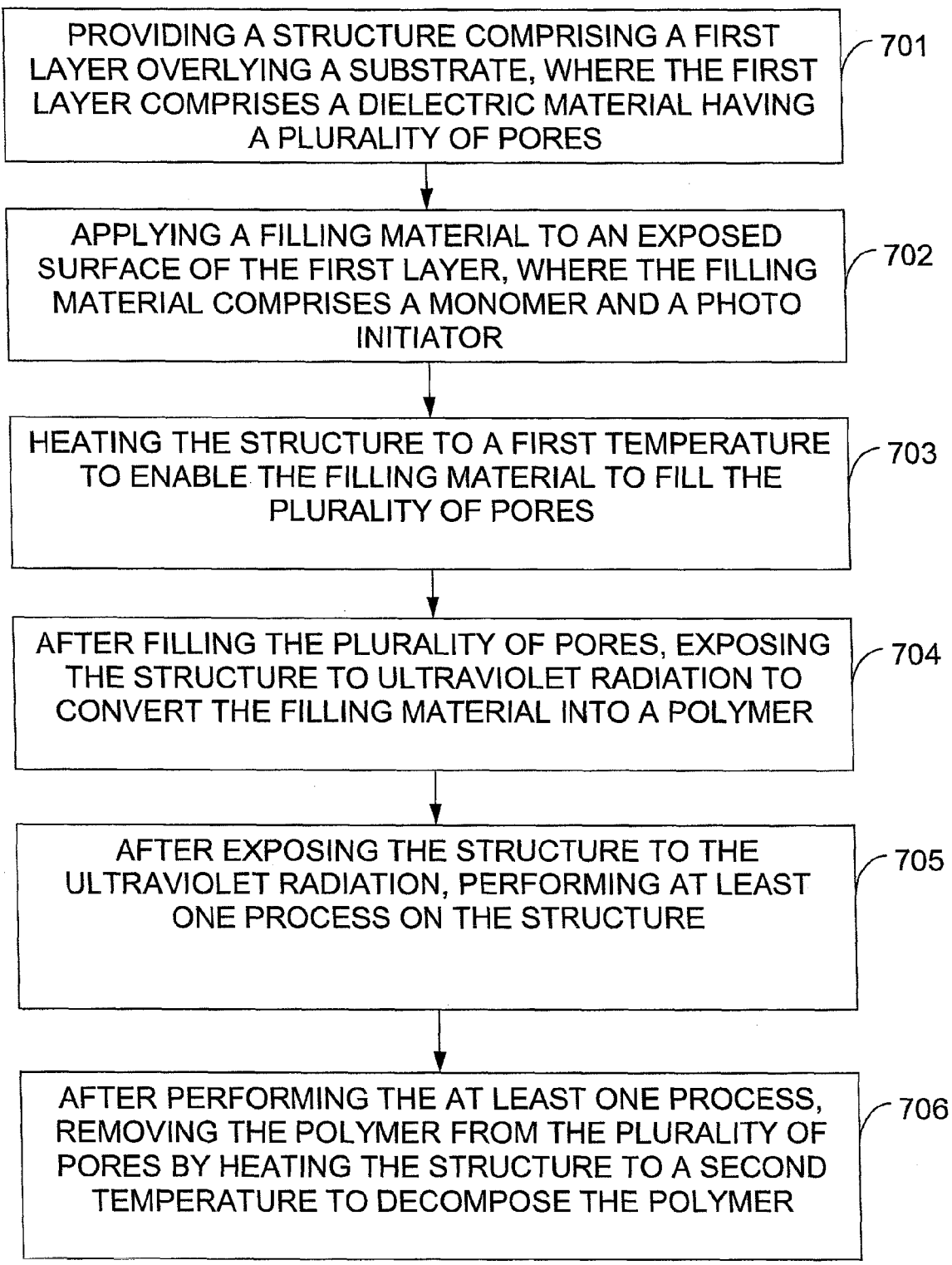

(5) In a further exemplary embodiment of the invention, and as illustrated in FIG. 17, a method comprising: providing a structure comprising a first layer overlying a substrate, where the first layer comprises a dielectric material having a plurality of pores (701); applying a filling material to an exposed surface of the first layer, where the filling material comprises a monomer and a photo initiator (702); heating the structure to a first temperature to enable the filling material to fill the plurality of pores (703); after filling the plurality of pores, exposing the structure to ultraviolet radiation to convert the filling material into a polymer (704); after exposing the structure to the ultraviolet radiation, performing at least one process on the structure (705); and after performing the at least one process, removing the polymer from the plurality of pores by heating the structure to a second temperature to decompose the polymer (706).

A method as above, where the filling of the plurality of pores with the filling material is homogeneous. A method as in any above, where the filling of the plurality of pores comprises a substantially thorough, complete and uniform filling of the plurality of pores with the filling material. A method as in any above, where the filling of the plurality of pores results in the first layer having a substantially uniform composition. A method as in any above, where the filling material comprises a material having a weight average molecular weight below about 10,000 g/mol. A method as in any above, where the first temperature is dependent on a size of the plurality of pores and a composition of the filling material. A method as in any above, where the first temperature is dependent on a composition of the dielectric material. A method as in any above, where the second temperature is greater than the first temperature. A method as in any above, where the first temperature is dependent on at least one of a composition of the filling material, a characteristic of the filling material, and a composition of the dielectric material.

A method as in any above, where the first temperature is dependent on at least one of a composition of the filling material and a characteristic of the filling material. A method as in any above, where the first temperature is selected to ensure homogeneous filling of the plurality of pores with the filling material. A method as in any above, where removing the filling material from the plurality of pores further comprises using ultraviolet irradiation. A method as in any above, further comprising one or more aspects of the exemplary embodiments of the invention as described herein.

A method as in any above, implemented as a computer program. A method as in any above, implemented as a computer program stored (e.g., tangibly embodied) on a computer-readable medium (e.g., a program storage device, a memory, a computer-readable memory medium, a non-transitory program storage device). A computer program comprising program instructions that, when performed by a processor, perform operations according to one or more (e.g., any one) of the methods described herein. A method as in any above, implemented as a program of instructions tangibly embodied on a program storage device, execution of the program of instructions by an apparatus (e.g., processor, data processor, machine, computer) resulting in operations comprising the steps of the method.

(6) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores (701); applying a filling material to an exposed surface of the first layer, where the filling material comprises a monomer and a photo initiator (702); heating the structure to a first temperature to enable the filling material to fill the plurality of pores (703); after filling the plurality of pores, exposing the structure to ultraviolet radiation to convert the filling material into a polymer (704); after exposing the structure to the ultraviolet radiation, performing at least one process on the structure (705); and after performing the at least one process, removing the polymer from the plurality of pores by heating the structure to a second temperature to decompose the polymer (706).

A program storage device as in any above, further comprising one or more aspects of the exemplary embodiments of the invention as described herein.

(7) In another exemplary embodiment of the invention, an apparatus comprising: means for providing a structure comprising a first layer overlying a substrate, where the first layer comprises a dielectric material having a plurality of pores; means for applying a filling material to an exposed surface of the first layer, where the filling material comprises a monomer and a photo initiator; means for heating the structure to a first temperature to enable the filling material to fill the plurality of pores; means for, after filling the plurality of pores, exposing the structure to ultraviolet radiation to convert the filling material into a polymer; means for, after exposing the structure to the ultraviolet radiation, performing at least one process on the structure; and means for, after performing the at least one process, removing the polymer from the plurality of pores by heating the structure to a second temperature to decompose the polymer.

An apparatus as in any above, further comprising one or more aspects of the exemplary embodiments of the invention as described herein.

Figure 18:
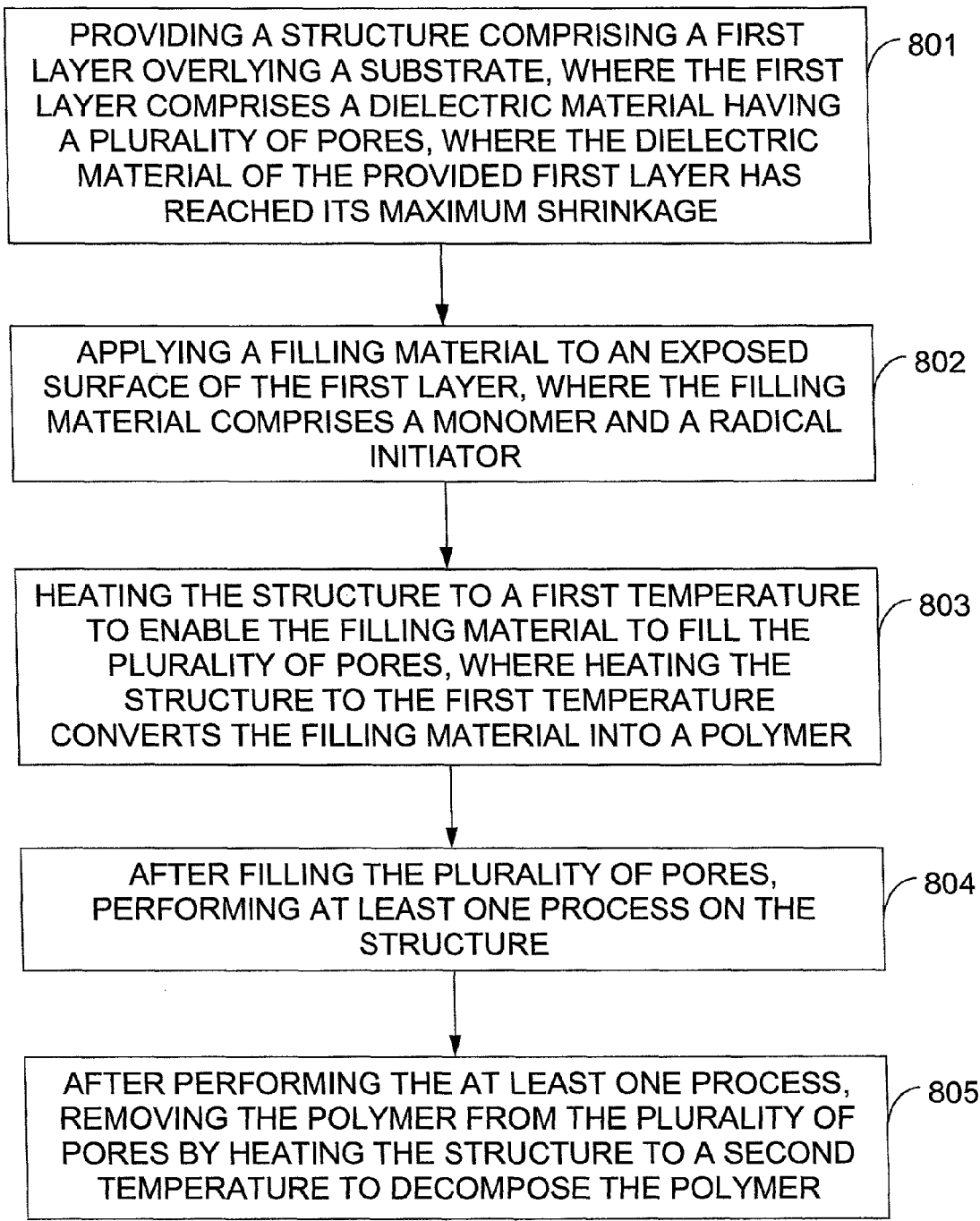

(8) In another exemplary embodiment of the invention, and as illustrated in FIG. 18, a method comprising: providing a structure comprising a first layer overlying a substrate, where the first layer comprises a dielectric material having a plurality of pores, where the dielectric material of the provided first layer has reached its maximum shrinkage (801); applying a filling material to an exposed surface of the first layer, where the filling material comprises a monomer and a radical initiator (802); heating the structure to a first temperature to enable the filling material to fill the plurality of pores, where heating the structure to the first temperature converts the filling material into a polymer (803); after filling the plurality of pores, performing at least one process on the structure (804); and after performing the at least one process, removing the polymer from the plurality of pores by heating the structure to a second temperature to decompose the polymer (805).

A method as above, where the filling of the plurality of pores with the filling material is homogeneous. A method as in any above, where the filling of the plurality of pores comprises a substantially thorough, complete and uniform filling of the plurality of pores with the filling material. A method as in any above, where the filling of the plurality of pores results in the first layer having substantially uniform composition. A method as in any above, where the filling material comprises a material having a weight average molecular weight below about 10,000 g/mol. A method as in any above, where the first temperature is dependent on a size of the plurality of pores and a composition of the filling material. A method as in any above, where the first temperature is dependent on a composition of the dielectric material. A method as in any above, where the second temperature is greater than the first temperature. A method as in any above, where the first temperature is dependent on at least one of a composition of the filling material, a characteristic of the filling material, and a composition of the dielectric material.

A method as in any above, where the first temperature is dependent on at least one of a composition of the filling material and a characteristic of the filling material. A method as in any above, where the first temperature is selected to ensure homogeneous filling of the plurality of pores with the filling material. A method as in any above, where removing the filling material from the plurality of pores further comprises using ultraviolet irradiation. A method as in any above, further comprising one or more aspects of the exemplary embodiments of the invention as described herein.

A method as in any above, implemented as a computer program. A method as in any above, implemented as a computer program stored (e.g., tangibly embodied) on a computer-readable medium (e.g., a program storage device, a memory, a computer-readable memory medium, a non-transitory program storage device). A computer program comprising program instructions that, when performed by a processor, perform operations according to one or more (e.g., any one) of the methods described herein. A method as in any above, implemented as a program of instructions tangibly embodied on a program storage device, execution of the program of instructions by an apparatus (e.g., processor, data processor, machine, computer) resulting in operations comprising the steps of the method.

(9) In another exemplary embodiment of the invention, a program storage device readable by a machine, tangibly embodying a program of instructions executable by the machine for performing operations, said operations comprising: providing a structure comprising a first layer overlying a substrate, where the first layer comprises a dielectric material having a plurality of pores, where the dielectric material of the provided first layer has reached its maximum shrinkage (801); applying a filling material to an exposed surface of the first layer, where the filling material comprises a monomer and a radical initiator (802); heating the structure to a first temperature to enable the filling material to fill the plurality of pores, where heating the structure to the first temperature converts the filling material into a polymer (803); after filling the plurality of pores, performing at least one process on the structure (804); and after performing the at least one process, removing the polymer from the plurality of pores by heating the structure to a second temperature to decompose the polymer (805).

A program storage device as in any above, further comprising one or more aspects of the exemplary embodiments of the invention as described herein.

(10) In another exemplary embodiment of the invention, an apparatus comprising: means for providing a structure comprising a first layer overlying a substrate, where the first layer comprises a dielectric material having a plurality of pores, where the dielectric material of the provided first layer has reached its maximum shrinkage; means for applying a filling material to an exposed surface of the first layer, where the filling material comprises a monomer and a radical initiator; means for heating the structure to a first temperature to enable the filling material to fill the plurality of pores, where heating the structure to the first temperature converts the filling material into a polymer; means for, after filling the plurality of pores, performing at least one process on the structure; and means for, after performing the at least one process, removing the polymer from the plurality of pores by heating the structure to a second temperature to decompose the polymer.

An apparatus as in any above, further comprising one or more aspects of the exemplary embodiments of the invention as described herein.

(11) In another exemplary embodiment, a method (e.g., for forming a porous dielectric material layer in an electronic structure) comprises: providing a pre-processed substrate; forming a porous dielectric layer (e.g., comprised of a layer of fully cured porous dielectric material) overlying the substrate; homogeneously refilling the pores of the porous dielectric layer with a filling material (e.g., a polymer, an organic polymer, in order to render the porous dielectric layer nonporous); performing processing on the structure (e.g., defining and patterning interconnect pattern openings in the dielectric layer; filling said interconnect pattern opening with an electrically conductive material; planarizing the electrically conductive material, for example, by chemical mechanical polishing); subsequently heating the substrate (e.g., the structure) to a temperature high enough to drive out said filling material from the pores (e.g., thus transforming the nonporous dielectric material into a porous dielectric material).

A method as in any above, further comprising one or more aspects of the exemplary embodiments of the invention as described herein. A method as in any above, implemented as a computer program. A method as in any above, implemented as a computer program stored (e.g., tangibly embodied) on a computer-readable medium (e.g., a program storage device, a memory, a computer-readable memory medium, a non-transitory program storage device). A computer program comprising program instructions that, when performed by a processor, perform operations according to one or more (e.g., any one) of the methods described herein. A method as in any above, implemented as a program of instructions tangibly embodied on a program storage device, execution of the program of instructions by an apparatus (e.g., processor, data processor, machine, computer) resulting in operations comprising the steps of the method.

The exemplary embodiments of the invention, as discussed herein and as particularly described with respect to exemplary methods, may be implemented in conjunction with a program storage device (e.g., at least one memory) readable by a machine (e.g., a processor), tangibly embodying a program of instructions (e.g., a program or computer program) executable by the machine for performing operations. The operations comprise steps of utilizing the exemplary embodiments or steps of the method.

The blocks shown in FIGS. 16-18 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 16-18 should be considered merely exemplary and non-limiting. It should be appreciated that the blocks shown in FIGS. 16-18 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 16-18 so as to implement one or more further exemplary embodiments of the invention.

That is, the exemplary embodiments of the invention shown in FIGS. 16-18 may be utilized, implemented or practiced in conjunction with one or more further aspects in any combination (e.g., any combination that is suitable, practicable and/or feasible) and are not limited only to the steps, blocks, operations and/or functions shown in FIGS. 16-18.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
    providing a structure comprising a first layer overlying a substrate, where the first layer comprises a dielectric material having a plurality of pores;
    applying a filling material to an exposed surface of the first layer, where the filling material comprises a monomer and a photo initiator;
    heating the structure to a first temperature to enable the filling material to fill the plurality of pores;
    after filling the plurality of pores, exposing the structure to ultraviolet radiation to convert the filling material into a polymer;
    after exposing the structure to the ultraviolet radiation, performing at least one process on the structure; and
    after performing the at least one process, removing the polymer from the plurality of pores by heating the structure to a second temperature to decompose the polymer;
    where the filling of the plurality of pores results in the first layer having a substantially uniform composition.

2. The method of claim 1, where the first temperature is dependent on at least one of a composition of the filling material, a characteristic of the filling material, and a composition of the dielectric material.

3. The method of claim 1, wherein the filling of the plurality of pores comprises a homogeneous filling of the plurality of pores comprising a substantially thorough, complete and uniform filling of the plurality of pores with the filling material.

4. The method of claim 1, where the first temperature is dependent on a size of the plurality of pores and a composition of the filling material.

5. The method of claim 1, where the first temperature is dependent on a composition of the dielectric material.

6. The method of claim 1, where the second temperature is greater than the first temperature.

7. The method of claim 1, where the first temperature is dependent on at least one of a composition of the filling material and a characteristic of the filling material.

8. The method of claim 1, where the first temperature is selected to ensure homogeneous filling of the plurality of pores with the filling material.

9. The method of claim 1, where heating the structure to a first temperature to enable the filling material to homogeneously fill the plurality of pores comprises filling 5% to 100% of the plurality of the pores with the filling material.

10. A method comprising:
    providing a structure comprising a first layer overlying a substrate, where the first layer comprises a dielectric material having a plurality of pores, where the dielectric material of the provided first layer has reached its maximum shrinkage;
    applying a filling material to an exposed surface of the first layer, where the filling material comprises a monomer and a radical initiator;
    heating the structure to a first temperature to enable the filling material to fill the plurality of pores, where heating the structure to the first temperature converts the filling material into a polymer;
    after filling the plurality of pores, performing at least one process on the structure; and
    after performing the at least one process, removing the polymer from the plurality of pores by heating the structure to a second temperature to decompose the polymer;
    where the filling of the plurality of pores results in the first layer having a substantially uniform composition.

11. The method of claim 10, where the first temperature is dependent on at least one of a composition of the filling material, a characteristic of the filling material, and a composition of the dielectric material.

12. The method of claim 10, wherein the filling of the plurality of pores comprises a homogeneous filling of the plurality of pores comprising a substantially thorough, complete and uniform filling of the plurality of pores with the filling material.

13. The method of claim 10, where the first temperature is dependent on a size of the plurality of pores and a composition of the filling material.

14. The method of claim 10, where the first temperature is dependent on a composition of the dielectric material.

15. The method of claim 10, where the second temperature is greater than the first temperature.

16. The method of claim 10, where the first temperature is dependent on at least one of a composition of the filling material and a characteristic of the filling material.

17. The method of claim 10, where the first temperature is selected to ensure homogeneous filling of the plurality of pores with the filling material.

18. The method of claim 10, where removing the polymer from the plurality of pores further comprises using ultraviolet irradiation.

* * * * *